United States Patent
Yang et al.

(10) Patent No.: US 11,980,043 B2
(45) Date of Patent: May 7, 2024

(54) DISPLAY PANEL METAL MASK IMPROVCED QUALITY STANDARD DETECTION AND INSPECTING METHOD THEREOF

(71) Applicant: Darwin Precisions Corporation, Hsinchu County (TW)

(72) Inventors: Yun-Pei Yang, Hsinchu County (TW); Mei-Lun Li, Hsinchu County (TW); Wen-Yi Lin, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 344 days.

(21) Appl. No.: 17/523,947

(22) Filed: Nov. 11, 2021

(65) Prior Publication Data
US 2022/0320438 A1 Oct. 6, 2022

(30) Foreign Application Priority Data
Mar. 31, 2021 (TW) .................................. 110112006

(51) Int. Cl.
*H10K 50/00* (2023.01)
*C23C 14/04* (2006.01)
*H10K 71/16* (2023.01)

(52) U.S. Cl.
CPC ........... *H10K 50/00* (2023.02); *C23C 14/042* (2013.01); *H10K 71/166* (2023.02)

(58) Field of Classification Search
None
See application file for complete search history.

(56) References Cited

U.S. PATENT DOCUMENTS

2019/0140178 A1*  5/2019  Ikenaga .................. H10K 71/00
2019/0203338 A1*  7/2019  Kawasaki .............. H10K 50/11

FOREIGN PATENT DOCUMENTS

| CN | 203451605 U | 2/2014 |
| CN | 104111030 A | 10/2014 |
| CN | 105568218 A | 5/2016 |
| JP | 2018-111880 A | 7/2018 |

* cited by examiner

*Primary Examiner* — Brandi N Hopkins
*Assistant Examiner* — Nigel H Plumb
(74) *Attorney, Agent, or Firm* — WPAT, P.C

(57) ABSTRACT

A metal mask and an inspecting method thereof are provided for improving quality standard detection. The metal mask has a first and a second long side and plural pattern regions. The method includes the followings steps Based on the pattern regions adjacent to the first and second long sides, a first and a second reference straight line adjacent to the first and second long sides respectively are defined. Then, a first maximum offset length between the pattern regions and the first reference straight line is measured. A second maximum offset length between the pattern regions and the second reference straight line is measured. When a difference between the first and second maximum offset lengths is less than or equal to 20 μm, the metal mask is determined to meet an inspecting standard.

18 Claims, 12 Drawing Sheets

DISPLAY PANEL METAL MASK IMPROVCED QUALITY STANDARD DETECTION AND INSPECTING METHOD THEREOF

CROSS-REFERENCE TO RELATED APPLICATION

This application claims priority to Taiwan Application Serial Number 110112006, filed Mar. 31, 2021, which is herein incorporated by reference.

BACKGROUND

Field of Invention

The present disclosure relates to a processing tool configured for patterning and an inspecting method thereof. More particularly, the present disclosure relates to a metal mask and an inspecting method thereof.

Description of Related Art

Nowadays, when some display panels, such as organic light emitting diode (OLED) display panels, are manufactured by using a fine metal mask (FMM) as one of the processing tools. Specifically, the OLED display panels are manufactured by evaporation. During the evaporation process, a fine metal mask is placed on a glass plate, and vapor plumes generated by the evaporation can be deposited on the glass plate according to multiple openings of the fine metal mask, so as to form a film in the OLED display panel, such as light-emitting layer.

At present, the display panels (including the OLED display panels) have been developed towards the high-resolution trend. In order to manufacture high-resolution display panels, not only the metal mask needs to have a significantly thin thickness, but also the tolerances in both the positions and the shapes of the openings of the metal mask cannot be excessively large. Otherwise, a defective display panel will be manufactured, thus causing a decrease in yield.

SUMMARY

At least one embodiment of the present disclosure provides an inspecting method of a metal mask, which can help screen metal masks to ensure that the metal mask meeting an inspecting standard is used, thereby achieving the objective of improving yield.

At least one embodiment of the present disclosure further provides a metal mask, which can be selected by using the above inspecting method.

An inspecting method of a metal mask according to at least one embodiment of the present disclosure includes providing a metal mask, where the metal mask has a first long side and a second long side opposite to each other, a first short side and a second short side opposite to each other, and a plurality of pattern regions. The first long side, the second long side, the first short side, and the second short side surround the pattern regions, and the pattern regions are arranged regularly. A first reference straight line and a second reference straight line are defined based on the pattern regions adjacent to the first long side and the second long side, where the first reference straight line is adjacent to the first long side and extends along the first long side, and the second reference straight line is adjacent to the second long side and extends along the second long side. Afterwards, a first maximum offset length between the pattern regions adjacent to the first long side and the first reference straight line is measured, where the first maximum offset length is perpendicular to the first reference straight line. A second maximum offset length between the pattern regions adjacent to the second long side and the second reference straight line is measured, where the second maximum offset length is perpendicular to the second reference straight line. The metal mask is determined to meet an inspecting standard, that is, a qualified metal mask is suitable for process use when a difference between the first maximum offset length and the second maximum offset length is less than or equal to 20 μm.

An inspecting method of a metal mask according to at least one embodiment of the present disclosure includes defining a first reference straight line and a second reference straight line that are parallel and separated from each other on a warped metal mask, where a length of the first reference straight line is L1, and a length of the second reference straight line is L2. Afterwards, the metal mask is flattened so that the first reference straight line becomes a first deformed line, and the second reference straight line becomes a second deformed line, where a length of the first deformed line is L3, and a length of the second deformed line is L4. Afterwards, the length L1 of the first reference straight line, the length L2 of the second reference straight line, the length L3 of the first deformed line, and the length L4 of the second deformed line are determined whether or not to satisfy the following mathematical formula:

$$|(L3+L4)/2-(L1+L2)/2|\leq 20 \text{ (μm)}.$$

The metal mask is determined to meet an inspecting standard when the length L1 of the first reference straight line, the length L2 of the second reference straight line, the length L3 of the first deformed line, and the length L4 of the second deformed line satisfy the mathematical formula.

An inspecting method of a metal mask according to at least one embodiment of the present disclosure includes providing a metal mask having a first long side and a second long side opposite to each other, a first short side and a second short side opposite to each other, and a plurality of pattern regions, where the first long side, the second long side, the first short side, and the second short side surround the pattern regions, and the pattern regions are arranged regularly. Afterwards, a first reference straight line and a second reference straight line are defined based on the pattern regions adjacent to the first long side and the second long side, where the first reference straight line is adjacent to the first long side and extends along the first long side, the second reference straight line is adjacent to the second long side and extends along the second long side. A first maximum offset length between the pattern regions adjacent to the first long side and the first reference straight line is measured, where the first maximum offset length is perpendicular to the first reference straight line. A second maximum offset length between the pattern regions adjacent to the second long side and the second reference straight line is measured, where the second maximum offset length is perpendicular to the second reference straight line. The metal mask is determined to be a mask that meets an inspecting standard, that is, a qualified metal mask meets the requirements of the process when any of the first maximum offset length and the second maximum offset length is less than or equal to 30 μm.

A metal mask according to at least one embodiment of the present disclosure includes a substrate. The substrate having a first long side and a second long side opposite to each other, a first short side and a second short side opposite to each other, and a plurality of pattern regions. The first long side, the first short side, the second long side, and the second short side are connected in sequence and surround the pattern regions, and a first reference straight line and a second reference straight line are defined on the substrate. In addition, the first reference straight line is adjacent to the first long side and extends along the first long side. The second reference straight line is adjacent to the second long side and extends along the second long side. There is a first maximum offset length between the pattern regions adjacent to the first long side and the first reference straight line, and the first maximum offset length is perpendicular to the first reference straight line. There is a second maximum offset length between the pattern regions adjacent to the second long side and the second reference straight line, and the second maximum offset length is perpendicular to the second reference straight line. A difference between the first maximum offset length and the second maximum offset length is less than or equal to 20 μm.

Based on the above, the inspecting method according to at least one embodiment of the present disclosure can help choose the qualified metal mask and eliminate the disqualified metal mask to reduce the output of defective display panels. As a result, the yield of the display panels is improved.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
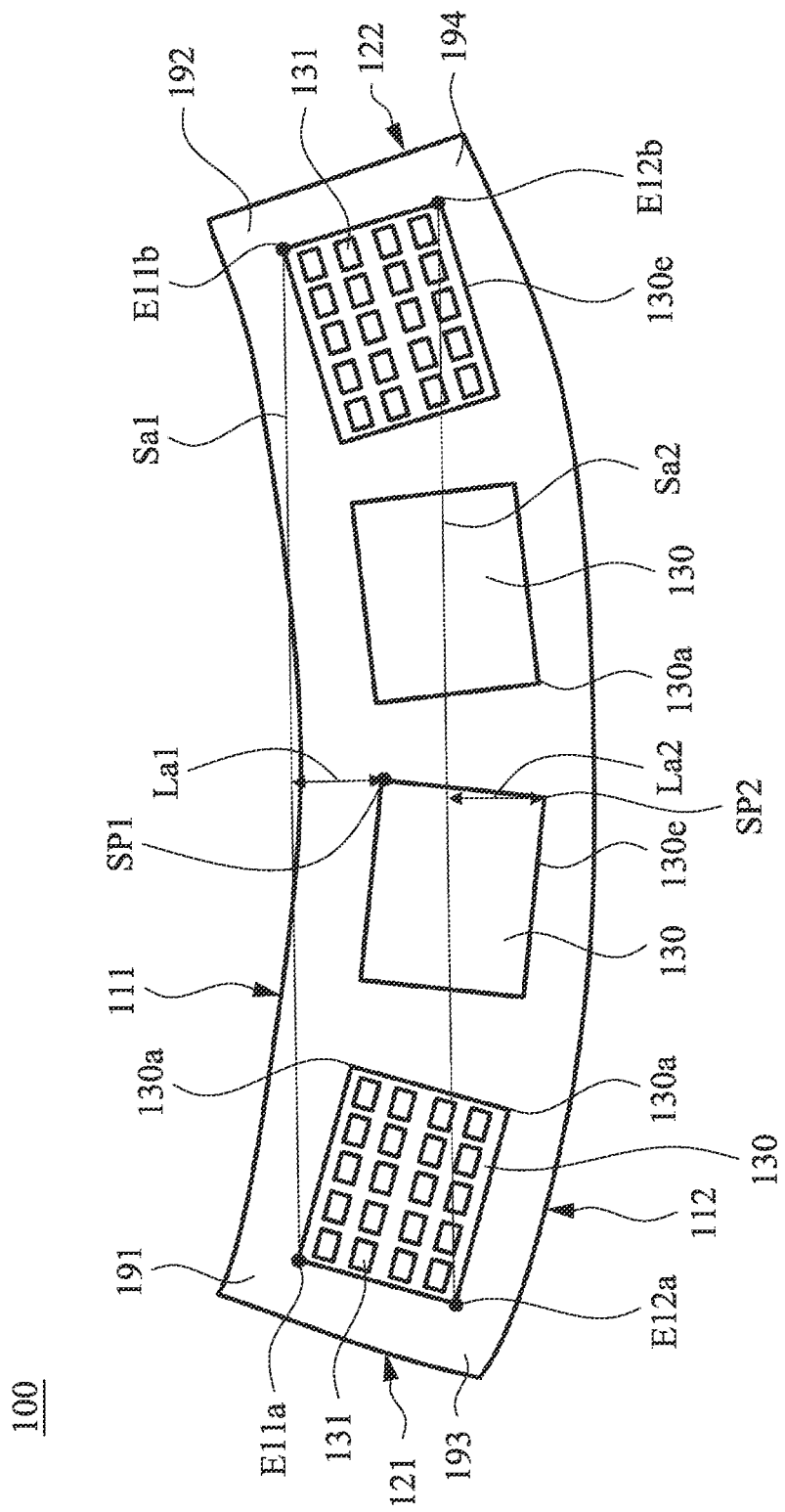
FIG. 1A depicts a schematic top view of a metal mask inspected by utilizing an inspecting method according to at least one embodiment of the present disclosure.

In the following specification, in order to clearly present the technical features of the present disclosure, the dimensions (such as length, width, thickness, and depth) of the elements (such as layer, film, substrate, and region, etc.) in the drawings are enlarged in unequal proportions. Hence, the embodiments described herein should not be construed as being limited to the particular dimensions and shapes of elements as illustrated herein but are to include deviations in dimensions, shapes, and both that result, for example, from practical processes and/or tolerances. For instance, regions shown or described as being flat may typically have rough and/or non-linear features. Besides, the acute angle as shown may be round. Therefore, the elements shown in the drawings are schematic in nature, and their shapes are not intended to show the exact shape of the elements, and are not intended to limit the scope of the claims.

The terms used herein such as "about", "approximate", or "substantial" include an explicitly stated value and value range, and include an acceptable deviation range of specific values determined by those with ordinary skills in the art with consideration of discussed measurement, errors, and tolerance related to the measurement. These errors and tolerance are, for example, caused by the limitations of both the measurement system and the process conditions. For instance, two objects (such as the plane or trace of the substrate) are "substantially parallel" or "substantially perpendicular", where "substantially parallel" and "substantially perpendicular" respectively represent the parallelism and perpendicularity between the two objects can include non-parallelism and non-perpendicularity caused by the acceptable deviation range.

In addition, "about" may mean within one or more standard deviations, or within, for example, ±30%, ±20%, ±15%, ±10%, ±5% of the stated value. Moreover, a relatively acceptable range of deviation or standard deviation may be chosen for the term "about", "approximately", or "substantially" as used herein based on optical properties, etching properties, mechanical properties or other properties, instead of applying one standard deviation across all the properties.

FIG. 1A depicts a schematic top view of a metal mask inspected by utilizing an inspecting method according to at least one embodiment of the present disclosure. A description is provided with reference to FIG. 1A. In the inspecting method according to the embodiment, a metal mask 100 is first provided. The metal mask 100 includes a substrate, which has a first long side 111 and a second long side 112 opposite to each other, a first short side 121 and a second short side 122 opposite to each other, and a plurality of pattern regions 130. The first long side 111, the first short side 121, the second long side 112, and the second short side 122 are connected in sequence and surround the pattern regions 130.

The metal mask 100 may be formed by calendering and photolithography (including etching) of a metal material in sequence, or may be formed by electroforming. The above metal material may be a metal sheet or a metal plate. Accordingly, the metal mask 100 does not necessarily take the shape of a rectangle. In other words, a shape of any one of the first long side 111, the second long side 112, the first short side 121, and the second short side 122 is not necessarily a straight line.

Taking FIG. 1A for example, the shapes of the first long side 111 and the second long side 112 are both curves, and the shapes of the first long side 111 and the second long side 112 shown in FIG. 1A may further be quadratic curves. However, in other embodiments, the shape of at least one of the first long side 111, the second long side 112, the first short side 121, and the second short side 122 may be a straight line, so the shape of any one of the first long side 111, the second long side 112, the first short side 121, and the second short side 122 is not limited to a straight line or a curve.

A shape of each of the pattern regions 130 may be a polygon, and these pattern regions 130 may be arranged regularly, such as a matrix arrangement. Taking FIG. 1A for example, four pattern regions 130 may be arranged in a 1×4 matrix, and the shape of each of the pattern regions 130 may be a quadrilateral, such as a rectangle. Each of the pattern regions 130 has a plurality of openings 131. A shape of each of the openings 131 may be a rectangle, and these openings 131 may be arranged regularly, such as a matrix arrangement, as shown in FIG. 1A.

The metal mask 100 may be configured for manufacturing a display panel, such as an OLED display panel. When the metal mask 100 is used for manufacturing a display panel, a size of each of the pattern regions 130 may be equivalent to a size of one OLED display panel, and a size of each of the openings 131 may be equivalent to a pixel, in which the pixel may be a sub-pixel. Alternatively, the pixel may be composed of multiple sub-pixels. When the evaporation is performed, the metal mask 100 can block part of the vapor plumes, so that the vapor plumes basically can only be deposited in the openings 131, thus forming a film in the OLED display panel, such as a light-emitting layer.

The metal mask 100 further has four corners, that is, a first corner 191, a second corner 192, a third corner 193, and a fourth corner 194. The first corner 191 is formed between the first long side 111 and the first short side 121, and the second corner 192 is formed between the first long side 111 and the second short side 122. The third corner 193 is formed between the second long side 112 and the first short side 121, and the fourth corner 194 is formed between the second long side 112 and the second short side 122.

After the metal mask 100 is provided, a first reference straight line Sa1 and a second reference straight line Sa2 are defined on the substrate based on the pattern regions 130 adjacent to the first long side 111 and the second long side 112. The first reference straight line Sa1 is adjacent to the first long side 111 and extends along the first long side 111, while the second reference straight line Sa2 is adjacent to the second long side 112 and extends along the second long side 112. Hence, The first reference straight line Sa1 does not intersect or overlap with the second reference straight line Sa2. Since the metal mask 100 can be formed by calendering and photolithography of the metal material in sequence, the metal mask 100 will become warped and uneven. Both the first reference straight line Sa1 and the second reference straight line Sa2 can be defined on the warped and uneven metal mask 100.

Each of the first reference straight line Sa1 and the second reference straight line Sa2 has end points. In the embodiment shown in FIG. 1A, the first reference straight line Sa1 has two end points E11a and E11b, and the second reference straight line Sa2 has two end points E12a and E12b. The two end points E11a and E11b are adjacent to the first short side 121 and the second short side 122 respectively, and the two end points E12a and E12b are also adjacent to the first short side 121 and the second short side 122 respectively. Since the first reference straight line Sa1 and the second reference straight line Sa2 both have the end points, the first reference straight line Sa1 and the second reference straight line Sa2 are not straight lines having the infinite length apiece. Hence, once positions of these end points E11a, E11b, E12a, and E12b are determined, the first reference straight line Sa1 and the second reference straight line Sa2 will be also defined.

Because the shape of each of the pattern regions 130 is the polygon, each of the pattern regions 130 has a plurality of vertices 130a. For example, the pattern region 130 in the shape of a quadrilateral has four vertices 130a in FIG. 1A. The two end points E11a and E11b of the first reference straight line Sa1 are located at the two vertices 130a adjacent to the first corner 191 and the second corner 192 respectively, while the two end points E12a and E12b of the second reference straight line Sa2 are located at the two vertices 130a adjacent to the third corner 193 and the fourth corner 194 respectively.

In other words, these end points E11a, E11b, E12a, and E12b shown in FIG. 1A can be substantially regarded as the four vertices 130a of the two pattern regions 130 which are respectively adjacent to the first short side 121 and the second short side 122. Therefore, in the embodiment shown in FIG. 1A, the first reference straight line Sa1 and the second reference straight line Sa2 are defined by the four vertices 130a adjacent to the first corner 191, the second corner 192, the third corner 193, and the fourth corner 194, so the end points E11a, E11b, E12a, and E12b are visible to the naked eye. In addition, since both the first reference straight line Sa1 and the second reference straight line Sa2 are basically virtual straight lines, the other portions of the first reference straight line Sa1 and the second reference straight line Sa2 are all virtual objects except for the end points E11a, E11b, E12a, and E12b.

After the first reference straight line Sa1 and the second reference straight line Sa2 are defined, that is, after the positions of these end points E11a, E11b, E12a, and E12b are determined, a first maximum offset length La1 between the pattern regions 130 adjacent to the first long side 111 and the first reference straight line Sa1 is measured, and a second maximum offset length La2 between the pattern regions 130 adjacent to the second long side 112 and the second reference straight line Sa2 is measured. The first maximum offset length La1 is perpendicular to the first reference straight line Sa1, and the second maximum offset length La2 is perpendicular to the second reference straight line Sa2.

It is noted that the first maximum offset length La1 and the first reference straight line Sa1 are "substantially perpendicular", and the second maximum offset length La2 and the second reference straight line Sa2 are also "substantially perpendicular". Hence, the perpendicularity between the first maximum offset length La1 and the first reference straight line Sa1 and the perpendicularity between the second maximum offset length La2 and the second reference straight line Sa2 both may include non-perpendicularity caused by an allowable tolerance range. Additionally, each of the pattern regions 130 actually has the openings 131, but for the sake of conciseness of the drawing and facilitating the presentation of the first maximum offset length La1 and the second maximum offset length La2, the openings 131 in the middle two pattern regions 130 in FIG. 1A are omitted.

The pattern regions 130 have a contour 130e apiece, and the contour 130e in a same pattern region 130 has four vertices 130a, as shown in FIG. 1A. In the embodiment, the first maximum offset length La1 is a maximum distance between the contours 130e adjacent to the first long side 111 and the first reference straight line Sa1, and the second maximum offset length La2 is a maximum distance between the contours 130e adjacent to the second long side 112 and the second reference straight line Sa2.

When a difference between the first maximum offset length La1 and the second maximum offset length La2 is less than or equal to 20 microns (μm), the metal mask 100 will be determined to meet an inspecting standard. That is, a tolerance range of the openings 131 in the metal mask 100 that meets the inspecting standard is within an allowable range of the process. Therefore, under the condition that the metal mask 100 does not have other defect(s) and substandard parameter(s), the metal mask 100 can be put into use in a relevant process, for example, physical vapor deposition (PVD), and the metal mask 100 that meets the inspecting standard is suitable for manufacturing a display panel, especially can be used to manufacture a high-resolution OLED display panel.

In addition, when the difference between the first maximum offset length La1 and the second maximum offset length La2 is greater than 20 μm, it means that errors of these openings 131 of the metal mask 100 are excessively large and do not meet the inspecting standard. As a result, a display panel (especially a high-resolution OLED display panel) made by using the metal mask 100 tends to cause, for example, defects including a shift in the light-emitting layer in the sub-pixel area, lack of light-emitting layers in some sub-pixel areas, or an excessive size difference among the light-emitting layers, etc. Therefore, this kind of metal mask 100 is not suitable for use in PVD, such as sputtering or evaporation, so that the metal mask 100 is determined to be a disqualified mask.

It is noted that even if the difference between the first maximum offset length La1 and the second maximum offset length La2 is less than or equal to 20 μm, the metal mask 100 may still be determined not to meet the inspecting standard. For example, when any one of the first maximum offset length La1 and the second maximum offset length La2 is greater than 30 μm, the metal mask 100 is determined to be the disqualified mask that does not meet the inspecting standard. In addition, when the difference between the first maximum offset length La1 and the second maximum offset length La2 is less than or equal to 20 μm, the first maximum offset length La1 is less than or equal to 30 μm, and the second maximum offset length La2 is also less than or equal to 30 μm, the metal mask 100 is determined to be a qualified mask that meets the inspecting standard.

It is noted that the above measurement of both the first maximum offset length La1 and the second maximum offset length La2, as well as the definition of both the first reference straight line Sa1 and the second reference straight line Sa2, can be performed by using a size measuring instrument. Specifically, the size measuring instrument can be used to first find these end points E11a, E11b, E12a, and E12b on the metal mask 100, so as to define the first reference straight line Sa1 and the second reference straight line Sa2.

The size measuring instrument can provide coordinate values for these end points E11a, E11b, E12a, and E12b. Taking the first reference straight line Sa1 for example, the coordinate values of the end point E11a can be (X1, Y1), and the coordinate values of the end point E11b can be (X2, Y2). Then, the coordinate values (X1, Y1) and (X2, Y2) of the above end points E11a and E11b substitute for the following mathematical formula (1) to calculate the first maximum offset length La1. After measuring the coordinate values (X1, Y1) and (X2, Y2) of the upper end points E11a and E11b, the size measuring instrument can perform the operation of the mathematical formula (1).

$$L = \frac{(Y1 - Y2)X + (X2 - X1)Y + Y2X1 - X2Y1}{\left(\sqrt{(Y1 - Y2)^2 + (X2 - X1)^2}\right)} \quad \text{Mathematical formula (1)}$$

In the above mathematical formula (1), L is equal to the first maximum offset length La1, and X and Y are coordinate values (X, Y) of one end point SP1 of the first maximum offset length La1, where the end point SP1 is located at the contour 130e, as shown in FIG. 1A. Similarly, the size measuring instrument can also provide the coordinate values for the end points E12a and E12b, so that the coordinate values of the end point E12a can be (X3, Y3), and the coordinate values of the end point E12b can be (X4, Y4). Then, the coordinate values (X3, Y3) and (X4, Y4) of the end points E12a and E12b substitute for the following mathematical formula (2). The size measuring instrument can perform the operation of the mathematical formula (2), too.

$$L = \frac{(Y3 - Y4)X + (X4 - X3)Y + Y4X3 - X4Y3}{\sqrt{(Y3 - Y4)^2 + (X4 - X3)^2}} \quad \text{Mathematical formula (2)}$$

The mathematical formula (2) is substantially the same as the above mathematical formula (1). Specifically, the mathematical formula (2) can be obtained by replacing X1 with X3, replacing X2 with X4, replacing Y1 with Y3, and replacing Y2 with Y4 in the mathematical formula (1). In the mathematical formula (2), L is equal to the second maximum offset length La2, and X and Y are coordinate values (X, Y) of one end point SP2 of the second maximum offset length La2, where the end point SP2 is also located at the contour 130e.

By utilizing the above mathematical formula (1) and (2), not only the size measuring instrument can define the first reference straight line Sa1 and the second reference straight line Sa2, but also it can measure the first maximum offset length La1 and the second maximum offset length La2 to determine whether or not the difference between the first maximum offset length La1 and the second maximum offset length La2 is greater than 20 μm, and determine whether or not there is any one of the first maximum offset length La1 and the second maximum offset length La2 greater than 30 μm, thereby eliminating the disqualified metal mask 100 and choosing the qualified metal mask 100 that meets the inspecting standard. Hence, the inspecting method according to the embodiment can prevent the metal mask 100 ineligible for PVD (for example, evaporation) from being used to manufacture display panel, thus reducing the output of defective display panels and improving the yield.

Figure 1B:
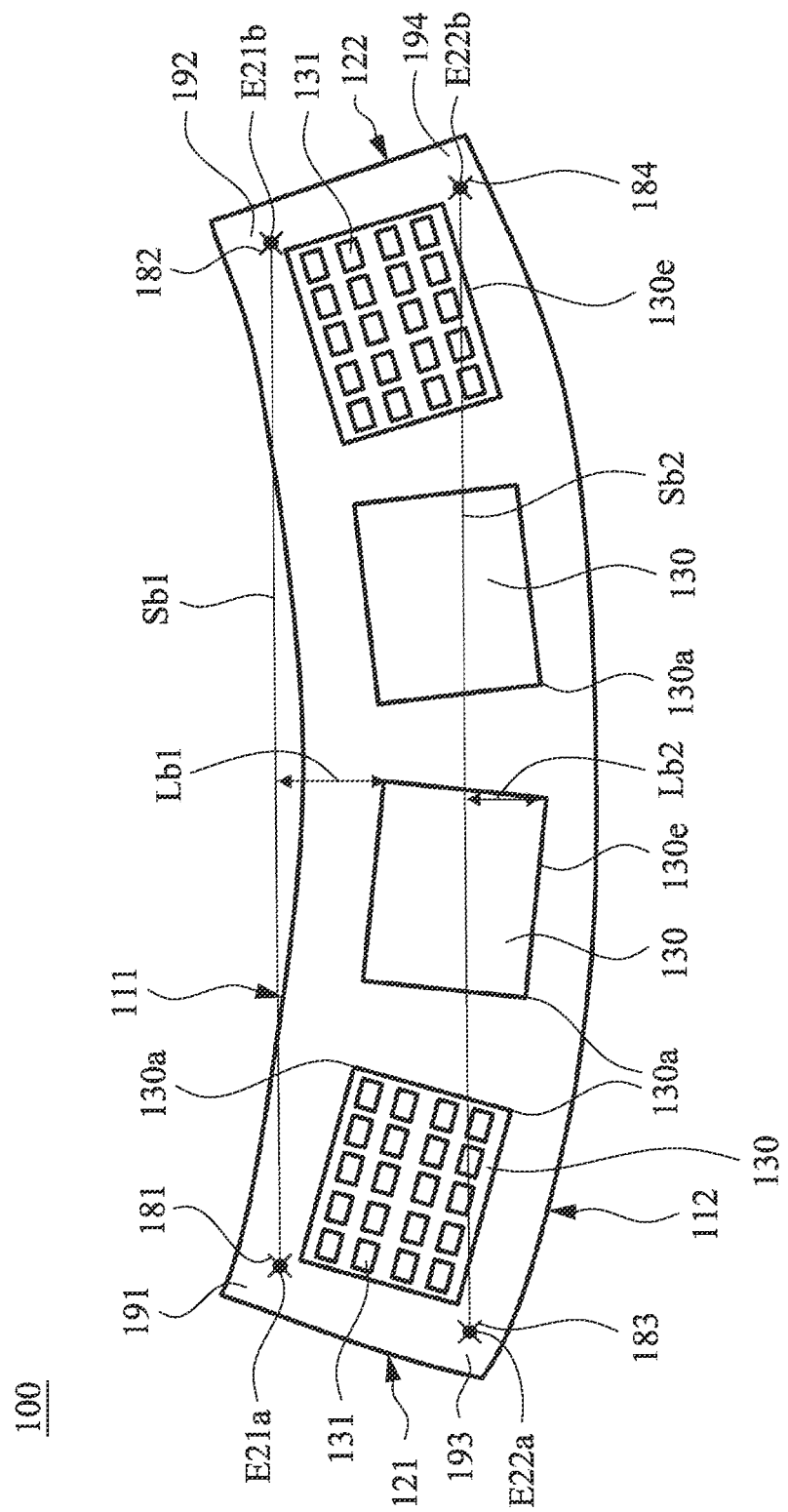
FIG. 1B depicts a schematic top view of a metal mask inspected by utilizing an inspecting method according to another embodiment of the present disclosure.

FIG. 1B depicts a schematic top view of a metal mask inspected by utilizing an inspecting method according to another embodiment of the present disclosure. Referring to FIG. 1B, the inspecting method of the embodiment is similar to the inspecting method of the above embodiment. For example, in the embodiment shown in FIG. 1B, a first maximum offset length Lb1 and a second maximum offset length Lb2 can also be measured by utilizing the mathematical formula (1) and (2). A difference between the embodiment and the previous embodiment only lies in that the definitions of both a first reference straight line Sb1 and a second reference straight line Sb2 in FIG. 1B are different from the definitions of both the first reference straight line Sa1 and the second reference straight line Sa2.

In the inspecting method of the embodiment, the first reference straight line Sb1 and the second reference straight line Sb2 are also defined based on the pattern regions 130 adjacent to the first long side 111 and the second long side 112, but unlike the embodiment shown in FIG. 1A, two end points E21a, E21b of the first reference straight line Sb1 and two end points E22a, E22b of the second reference straight line Sb2 are all located outside the pattern regions 130 and adjacent to the first corner 191, the second corner 192, the third corner 193, and the fourth corner 194 respectively.

Additionally, these end points E21a, E21b, E22a, and E22b may be respectively located on a plurality of marks visible to the naked eye made on the metal mask 100. Taking FIG. 1B for example, the metal mask 100 may further have a first mark 181, a second mark 182, a third mark 183, and a fourth mark 184 that are visible to the naked eye. The first mark 181 is adjacent to the first corner 191, the second mark 182 is adjacent to the second corner 192, the third mark 183 is adjacent to the third corner 193, and the fourth mark 184 is adjacent to the fourth corner 194. The end point E21a is located on the first mark 181, the end point E21b is located on the second mark 182, the end point E22a is located on the third mark 183, and the end point E22b is located on the fourth mark 184. Hence, the other portions of both the first reference straight line Sb1 and the second reference straight line Sb2 are all virtual objects except for the end points E21a, E21b, E22a, and E22b.

Figure 1C:
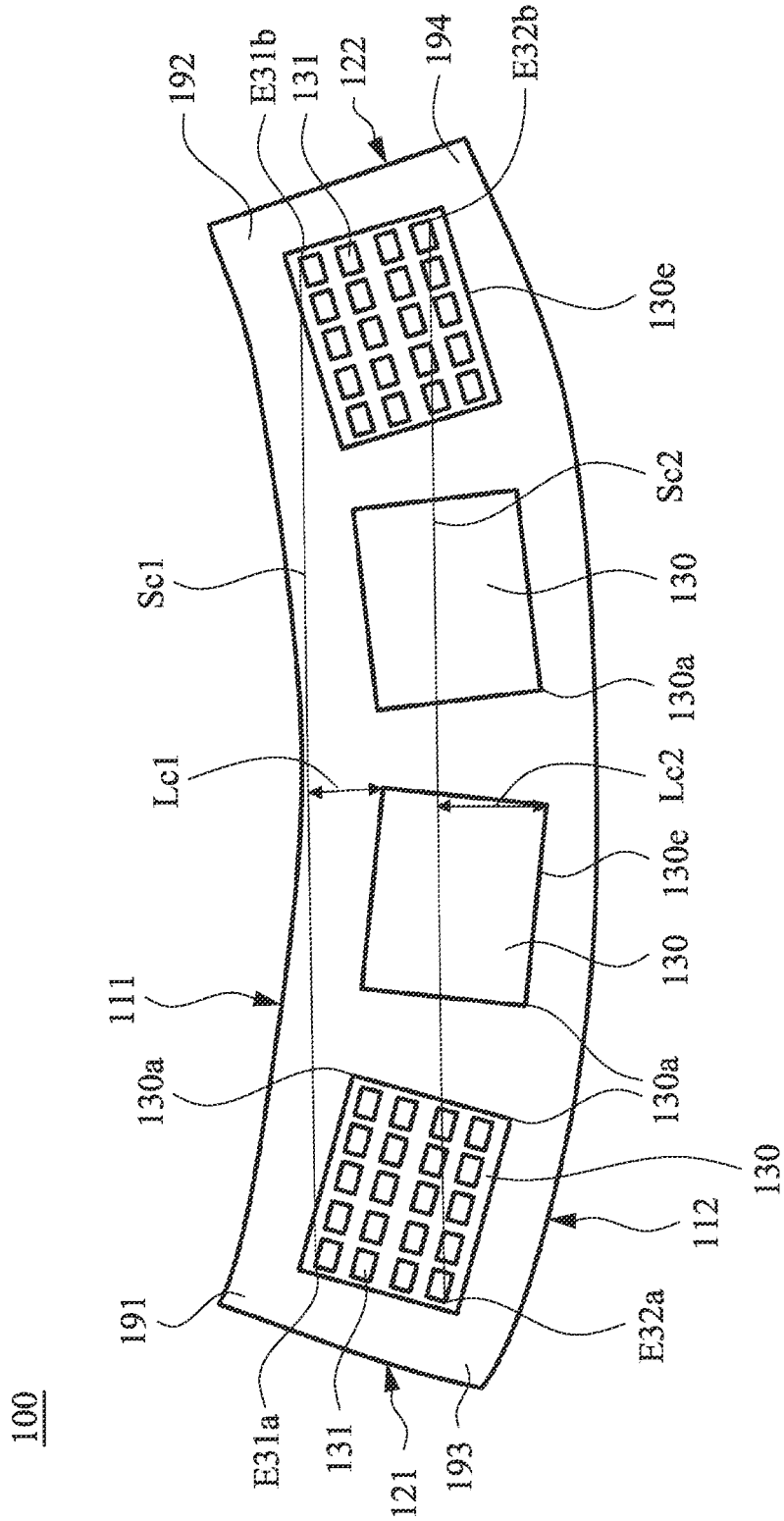
FIG. 1C depicts a schematic top view of a metal mask inspected by utilizing an inspecting method according to still another embodiment of the present disclosure.

FIG. 1C depicts a schematic top view of a metal mask inspected by utilizing an inspecting method according to still another embodiment of the present disclosure. Referring to FIG. 10, the inspecting method of the present embodiment is similar to the inspecting methods shown in FIG. 1A and FIG. 1B. For example, in the embodiment shown in FIG. 1C, a first maximum offset length Lc1 and a second maximum offset length Lc2 can also be measured by utilizing the mathematical formula (1) and (2). However, definitions of both a first reference straight line Sc1 and a second reference straight line Sc2 in the present embodiment are different from the definitions of the first reference straight lines Sa1, Sb1 and the second reference straight lines Sa2, Sb2.

During the process of defining the first reference straight line Sc1 and the second reference straight line Sc2, two end points E31a and E31b of the first reference straight line Sc1 are located at positions of the two openings 131 adjacent to the first corner 191 and the second corner 192 respectively. Two end points E32a and E32b of the second reference straight line Sc2 are located at positions of the two openings 131 adjacent to the third corner 193 and the fourth corner 194 respectively. Taking FIG. 1C for example, these end points E31a, E31b, E32a, and E32b may be located at edges of these openings 131. Alternatively, in other embodiments, each of these end points E31a, E31b, E32a, and E32b may be located in one of these openings 131. As a result, these end points E31a, E31b, E32a, and E32b are all located within the pattern regions 130.

Figure 1D:
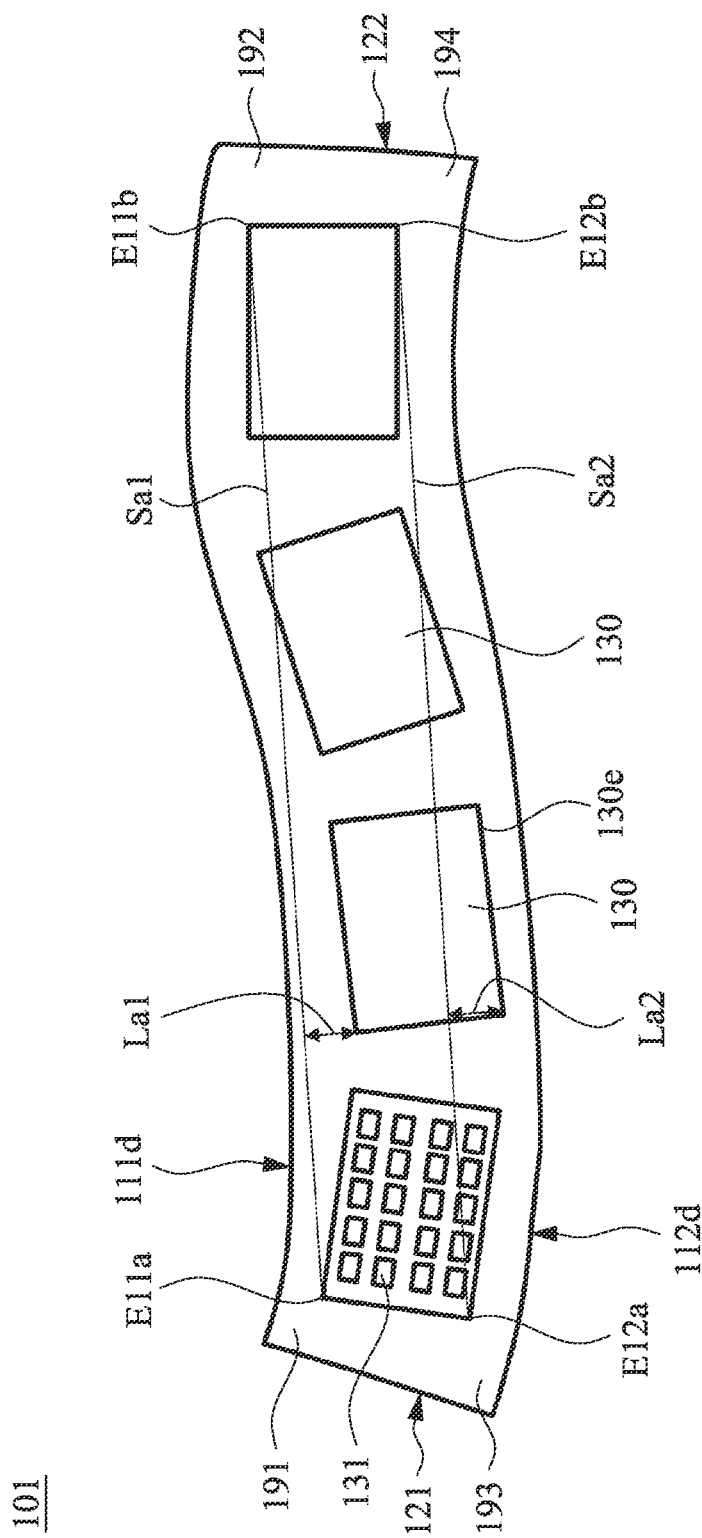
FIG. 1D depicts a schematic top view of a metal mask inspected by utilizing an inspecting method according to yet another embodiment of the present disclosure.

FIG. 1D depicts a schematic top view of a metal mask inspected by utilizing an inspecting method according to yet another embodiment of the present disclosure. Referring to FIG. 1D, the inspecting method shown in FIG. 1D is substantially the same as the inspecting method shown in FIG. 1A, and a metal mask 101 of FIG. 1D may be the same as the metal mask 100. For example, the metal mask 101 may also be formed by calendering and photolithography of a metal material in sequence, or may be formed by electroforming. However, both the shapes of the first long side 111 and the second long side 112 shown in FIG. 1A are quadratic curves, but the shapes of a first long side 111d and a second long side 112d shown in FIG. 1D are both curves with at least one inflection point.

Although in the metal mask 101 shown in FIG. 1D, the first long side 111d and the second long side 112d are not quadratic curves, the two end points E11a and E11b are located at the two vertices 130a adjacent to the first corner 191 and the second corner 192 respectively, and the two end points E12a and E12b are located at the two vertices 130a adjacent to the third corner 193 and the fourth corner 194 respectively in the embodiment of FIG. 1D. Moreover, the first maximum offset length La1 is the maximum distance between the contours 130e adjacent to the first long side 111 and the first reference straight line Sa1, while the second maximum offset length La2 is the maximum distance between the contours 130e adjacent to the second long side 112 and the first reference straight line Sa2.

Hence, no matter whether the first long side 111d and the second long side 112d have the inflection points or not, the definitions of the first reference straight line Sa1 and the second reference straight line Sa2 in FIG. 1D are the same as the definitions of the first reference straight line Sa1 and the second reference straight line Sa2 in FIG. 1A, and the definitions of the first maximum offset length La1 and the second maximum offset length La2 in FIG. 1D are the same as the definitions of the first maximum offset length La1 and the second maximum offset length La2 in FIG. 1A. In addition, the end points E11a, E11b, E12a, and E12b in FIG. 1D may be located outside the pattern regions 130 (as shown in FIG. 1B), or located in the openings 131 of the pattern regions 130 (as shown in FIG. 1C) in other embodiments. Hence, the definitions of both the first reference straight line Sa1 and the second reference straight line Sa2 in FIG. 1D may be substantially the same as the definitions of the first reference straight lines Sb1, Sc1 and the second reference straight line Sb2, Sc2.

Figure 2:
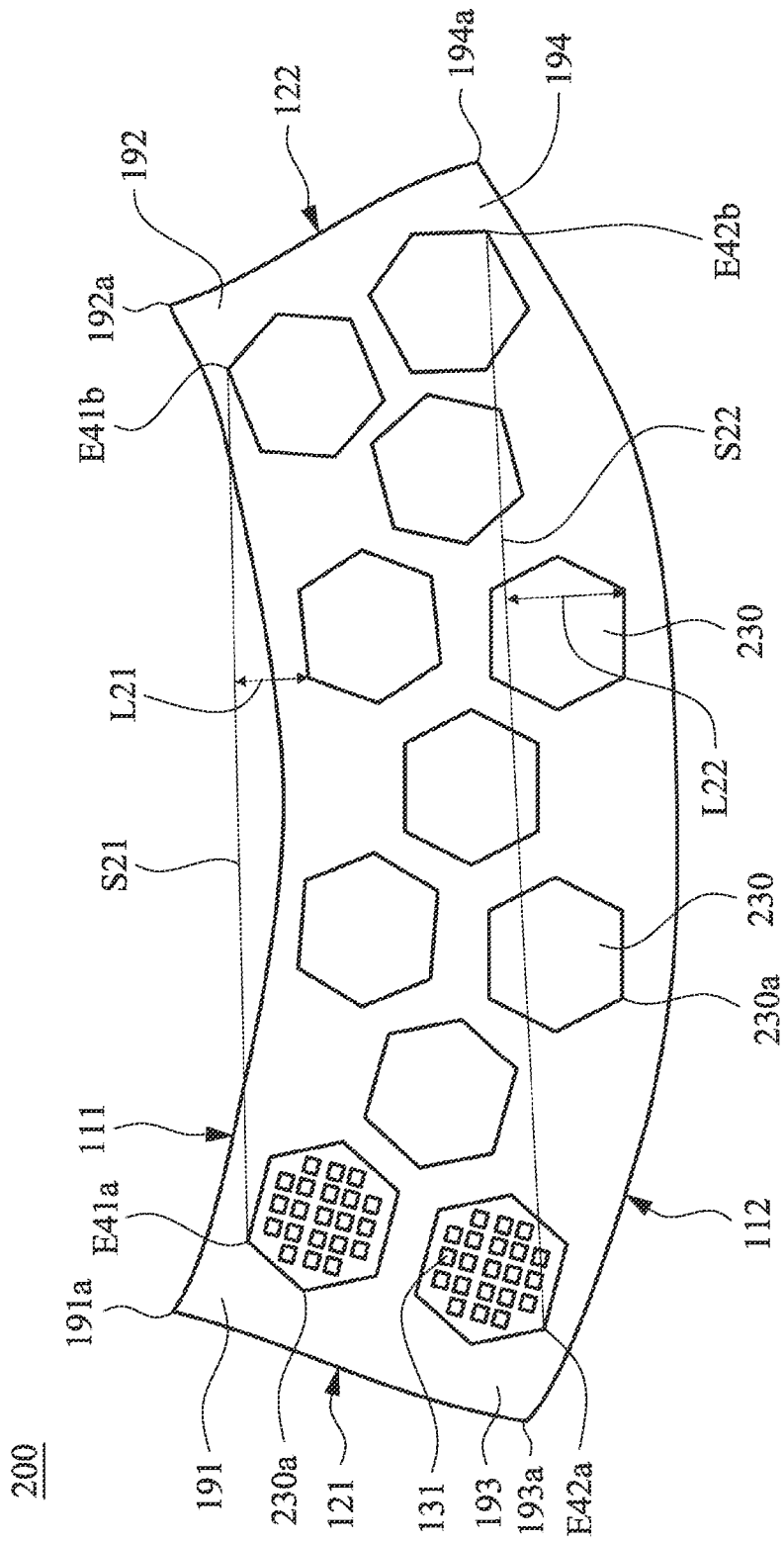
FIG. 2 depicts a schematic top view of a metal mask inspected by utilizing an inspecting method according to another embodiment of the present disclosure.

FIG. 2 depicts a schematic top view of a metal mask inspected by utilizing an inspecting method according to another embodiment of the present disclosure. Referring to FIG. 2, the embodiment is similar to the previous embodiments. For example, a metal mask 200 has a plurality of pattern regions 230, which may be regularly arranged. Additionally, each of the pattern regions 230 also has a plurality of openings 131, and a shape of each of the pattern regions 230 is also a polygon. However, unlike the pattern regions 130 in the previous embodiments, the shape of each of the pattern regions 230 is a hexagon, and the pattern regions 230 are not arranged in a matrix in the embodiment.

The inspecting method of the metal mask 200 is basically the same as the inspecting method of the metal mask 100. In the inspecting method of the metal mask 200, a first reference straight line S21 is defined based on the pattern regions 230 adjacent to the first long side 111, while a second reference straight line S22 is defined based on the pattern regions 230 adjacent to the second long side 112. The first reference straight line S21 is adjacent to the first long side 111 and extends along the first long side 111. The second reference straight line S22 is adjacent to the second long side 112 and extends along the second long side 112.

Each of the pattern regions 230 also has a plurality of vertices 230a. For example, one pattern region 230 has six vertices 230a (as shown in FIG. 2). Like the embodiment of FIG. 1A, two end points E41a and E41b of the first reference straight line S21 are located at the two vertices 230a adjacent to the first corner 191 and the second corner 192 respectively. Two end points E42a and E42b of the second reference straight line S22 are located at the two vertices 230a adjacent to the third corner 193 and the fourth corner 194 respectively. Hence, these end points E41a, E41b, E42a, and E42b can be substantially regarded as the vertices 230a of four pattern regions 230, in which two pattern regions 230 are adjacent to the first short side 121, whereas the other two pattern regions 230 are adjacent to the second short side 122.

The first corner 191 has a first vertex 191a, and the first long side 111 and the first short side 121 intersect at the first vertex 191a. The second corner 192 has a second vertex 192a, and the first long side 111 and the second short side 122 intersect at the second vertex 192a. The third corner 193 has a third vertex 193a, and the second long side 112 and the first short side 121 intersect at the third vertex 193a. The fourth corner 194 has a fourth vertex 194a, and the second long side 112 and the second short side 122 intersect at the four vertices 194a.

In the embodiment, the end points E41a, E41b, E42a, and E42b are determined according to the vertices 230a adjacent to the first vertex 191a, the second vertex 192a, the third vertex 193a, and the fourth vertex 194a. In detail, in the first corner 191, the end point E41a is located at the vertex 230a closest to the first vertex 191a. Similarly, the end point E41b is located at the vertex 230a closest to the second vertex 192a. The end point E42a is located at the vertex 230a closest to the third vertex 193a. The end point E42b is located at the vertex 230a closest to the fourth vertex 194a.

After the first reference straight line S21 and the second reference straight line S22 are defined, a first maximum offset length L21 between the pattern regions 230 adjacent to the first long side 111 and the first reference straight line S21 is measured, and a second maximum offset length L22 between the pattern regions 230 adjacent to the second long side 112 and the second reference straight line S22 is measured. The first maximum offset length L21 is substantially perpendicular to the first reference straight line S21, and the second maximum offset length L22 is substantially perpendicular to the second reference straight line S22.

When a difference between the first maximum offset length L21 and the second maximum offset length L22 is greater than 20 μm, or any one of the first maximum offset length La1 and the second maximum offset length La2 is greater than 30 μm, the metal mask 200 is determined to be a disqualified mask. When the difference between the first maximum offset length L21 and the second maximum offset length L22 is less than or equal to 20 μm, the first maximum offset length L21 is less than or equal to 30 μm, and the second maximum offset length L22 is also less than or equal to 30 μm, the metal mask 200 is determined to be a qualified mask and meet the inspecting standard.

In addition, the measurement methods of both the first maximum offset length L21 and the second maximum offset length L22 may be the same as those of the first maximum offset length La1 and the second maximum offset length La2 in the previous embodiments. For example, the first maximum offset length L21 and the second maximum offset length L22 can be measured by a size measuring instrument. The size measuring instrument can define the first reference straight line S21 and the second reference straight line S22, and utilize the above mathematical formula (1) and (2) to calculate the first maximum offset length L21 and the second maximum offset length L22. Since the measurement methods for both the first maximum offset length L21 and the second maximum offset length L22 may be the same as those in the previous embodiments, a description (about the measurement methods) in this regard is repeated again.

It is noted that in the embodiment shown in FIG. 2, the two ends points E41a and E41b of the first reference straight line S21 and the two end points E42a and E42b of the second reference straight line S22 are respectively located at the four vertices 230a. The end points E41a and E42a are located at the vertices 230a of the outermost pattern regions 230 adjacent to the first short side 121, and the end points E41b and E42b are located at the vertices 230a of the outermost pattern regions 230 adjacent to the second short side 122.

However, in other embodiments, these end points E41a, E41b, E42a, and E42b adjacent to the first corner 191, the second corner 192, the third corner 193, and the fourth corner 194 respectively can all located outside the pattern regions 230. In other words, each of these end points E41a, E41b, E42a, and E42b may not be within any of the pattern regions 230a and can be adjacent to one of corners of the metal mask 200 (i.e., the first corner 191, the second corner 192, the third corner 193, or the fourth corner 194).

Alternatively, the two end points E41a and E41b of the first reference straight line S21 may be located at positions of the two openings 131 adjacent to the first corner 191 and the second corner 192 respectively, and the two end points E42a and E42b of the second reference straight line S22 are located at positions of the two openings 131 adjacent to the third corner 193 and the fourth corner 194 respectively. For example, each of these end points E41a, E41b, E42a, and E42b may be located at an edge of one of the openings 131 (as shown in FIG. 1C) or located in one of the openings 131. As a result, any of the end points E41a, E41b, E42a, and E42b shown in FIG. 2 is not limited to being located at the vertex 230a.

Figure 3:
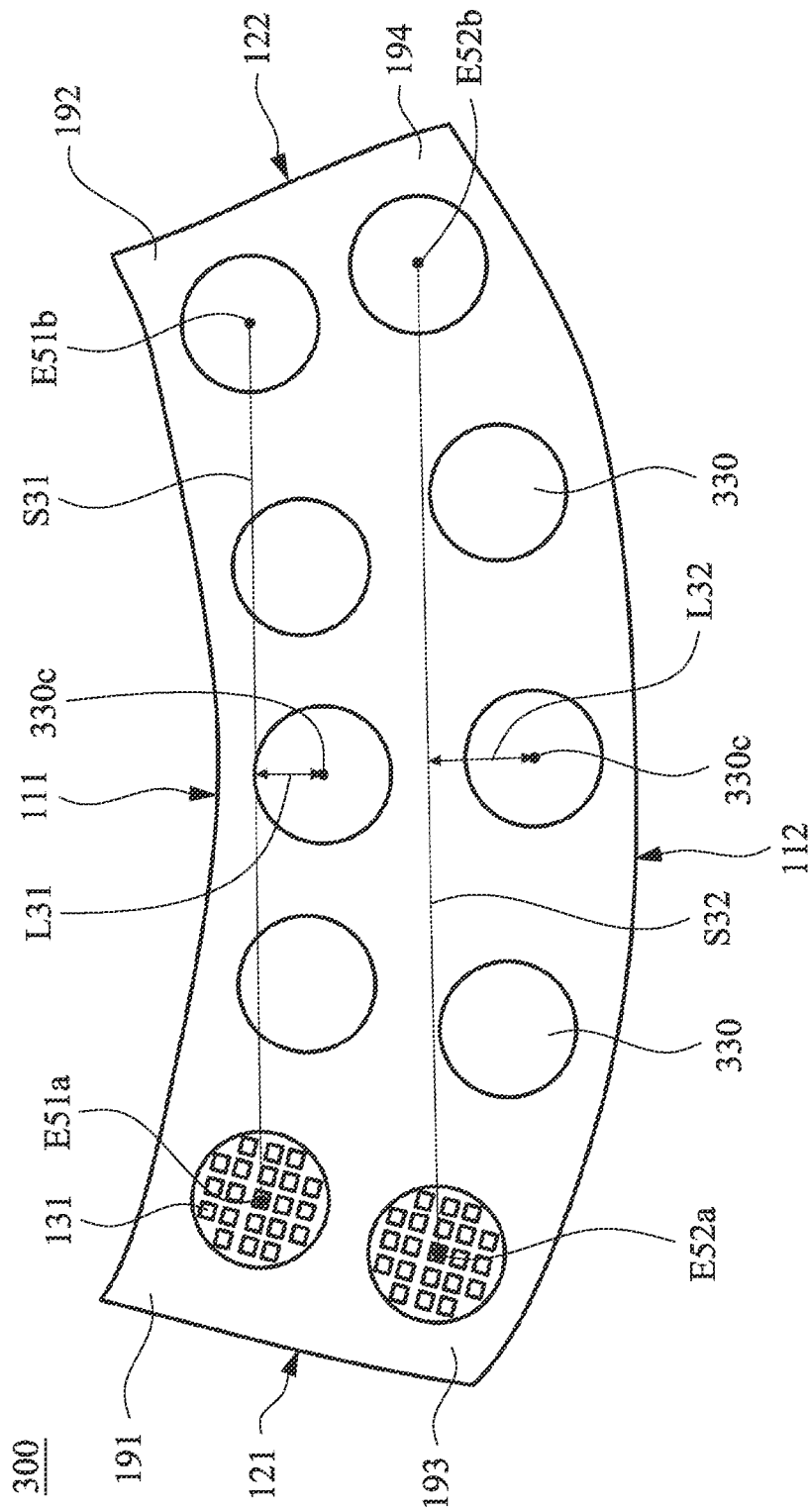
FIG. 3 depicts a schematic top view of a metal mask inspected by utilizing an inspecting method according to still another embodiment of the present disclosure.

FIG. 3 depicts a schematic top view of a metal mask inspected by utilizing an inspecting method according to still another embodiment of the present disclosure. Referring to FIG. 3, the embodiment is similar to the previous embodiments. For example, a metal mask 300 has a plurality of pattern regions 330, and the pattern regions 330 may be arranged regularly, for example, a matrix arrangement, as shown in FIG. 3, in which each of the pattern regions 330 also has a plurality of openings 131. However, unlike the above pattern regions 130 and 230, a shape of each of the pattern regions 330 in the embodiment is a circle, so that each of the pattern regions 330 has a center 330c.

The inspecting method of the embodiment is similar to the inspecting methods of the above embodiments, and a first maximum offset length L31 and a second maximum offset length L32 can also be measured by utilizing the mathematical formula (1) and (2) in the embodiment. Differences between the inspecting method of the present embodiment and the inspecting methods of the previous embodiments lie in that the definitions of both a first reference straight line S31 and a second reference straight line S32 in FIG. 3 is different from the definitions of the first reference straight lines Sa1 and the second reference straight line Sa2. Moreover, in FIG. 3, the first maximum offset length L31 is different from the above first maximum offset length La1, Lb1, Lc1 or L21, and the second maximum offset length L32 is different from the above second maximum offset length La2, Lb2, Lc2 or L22.

Two end points E51a and E51b of the first reference straight line S31 are located at the two centers 330c adjacent to the first corner 191 and the second corner 192 respectively, and two end points E52a and E52b of the second reference straight line S32 are located at the two centers 330c adjacent to the third corner 193 and the fourth corner 194 respectively. The first maximum offset length L31 substantially perpendicular to the first reference straight line S31 is a maximum distance between the centers 330c adjacent to the first long side 111 and the first reference straight line S31, and the second maximum offset length L32 substantially perpendicular to the second reference straight line S32 is a maximum distance between the centers 330c adjacent to the second long side 112 and the second reference straight line S32.

It is worth mentioning that in the embodiments of FIG. 1A to FIG. 1D and FIG. 2 to FIG. 3, any of the end points of both the first reference straight lines and the second reference straight lines (i.e., the end points E11a, E11b, E12a, E12b, E21a, E21b, E22a, E22b, E31a, E31b, E32a, E32b, E41a, E41b, E42a, E42b, E51a, E51b, E52a, or E52b) is adjacent to one of the first corner 191, the second corner 192, the third corner 193, and the fourth corner 194. Hence, an individual length of each of the first reference straight lines and the second reference straight lines is less than but close to the length of each of the metal masks 100, 200 and 300.

As a result, even though the definitions of the first reference straight lines Sa1, Sb1, Sc1, S21, and S31 are different, the first maximum offset lengths La1, Lb1, Lc1, L21, and L31 calculated by the mathematical formula (1) do not have significant differences. Similarly, even though the definitions of the second reference straight lines Sa2, Sb2, Sc2, S22, and S32 are different, the second maximum offset lengths La2, Lb2, Lc2, L22, and L32 calculated by the mathematical formula (2) do not have significant differences. In other words, the first reference straight lines Sa1, Sb1, Sc1, S21, and S31 and the second reference straight lines Sa2, Sb2, Sc2, S22, and S32 can all be calculated by the above mathematical formula (1) and (2) to obtain the above first maximum offset lengths and second maximum offset lengths.

Figure 4:
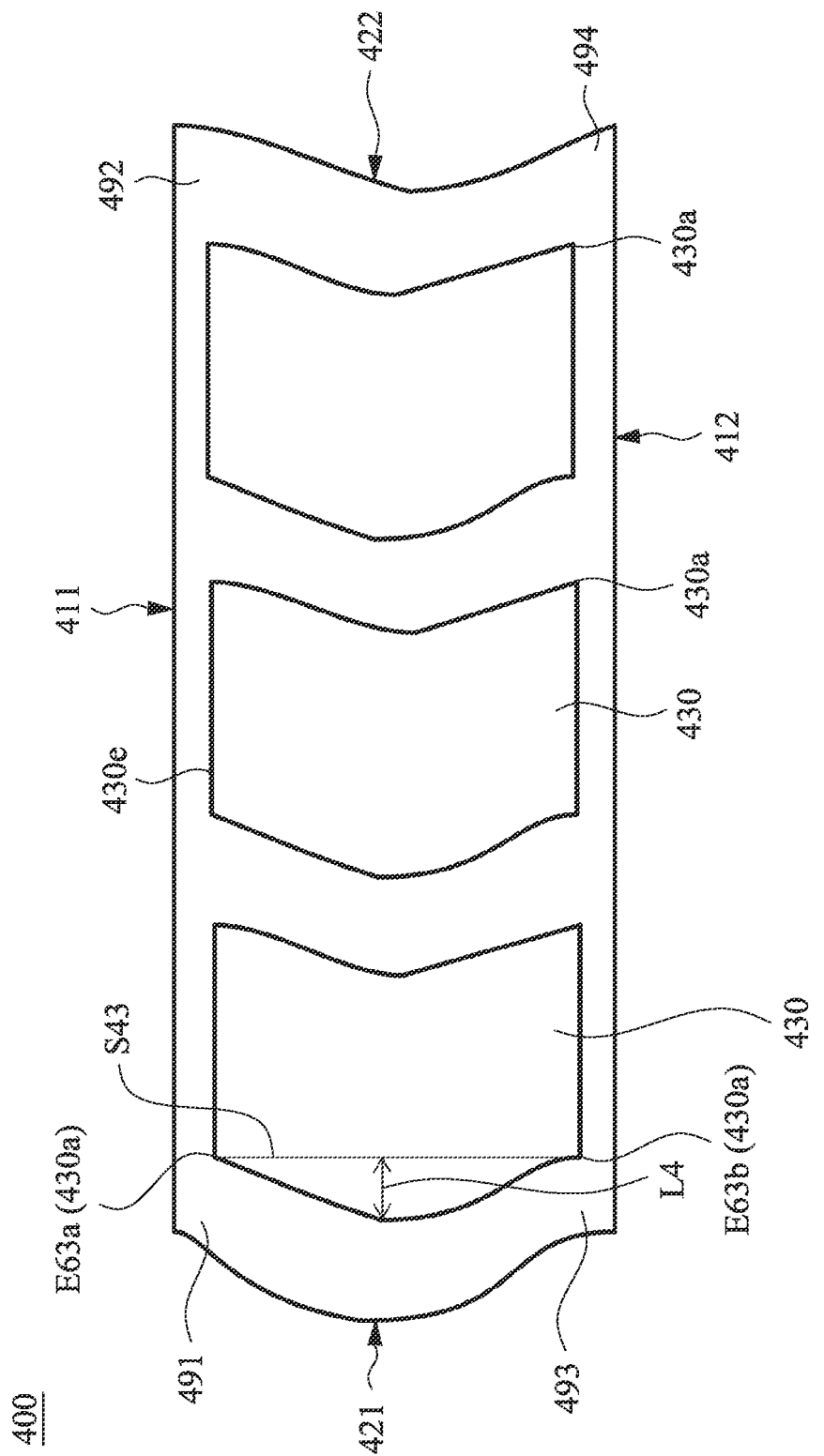
FIG. 4 depicts a schematic top view of a metal mask inspected by utilizing an inspecting method according to yet another embodiment of the present disclosure.

FIG. 4 depicts a schematic top view of a metal mask inspected by utilizing an inspecting method according to yet another embodiment of the present disclosure. Referring to FIG. 4, the inspecting method of the embodiment is similar to the inspecting methods of the previous embodiments. However, unlike the previous embodiments, the inspecting method of the embodiment not only measures the first maximum offset length and the second maximum offset length, but also defines a third reference straight line S43 and measures a third maximum offset length L4.

In the embodiment, a metal mask 400 has a first long side 411 and a second long side 412 opposite to each other, a first short side 421 and a second short side 422 opposite to each other, and a plurality of pattern regions 430. The first long side 411, the second long side 412, the first short side 421, and the second short side 422 are connected and surround the pattern regions 430. A material and manufacturing method of the metal mask 400 shown in FIG. 4 may be the same as the material and manufacturing method of the metal mask 100, and each of the pattern regions 430 has a plurality of openings (not shown), in which the openings can be arranged regularly.

In the method of inspecting the metal mask 400, the third reference straight line S43 is defined based on the pattern regions 430 adjacent to the first short side 421, in which the third reference straight line S43 is adjacent to the first short side 421 and extends along the first short side 421. As the same as the above first reference straight lines and second reference straight lines, the third reference straight line S43 has end points E63a and E63b, so the third reference straight line S43 is also not a straight line with infinite length. Once the positions of these end points E63a and E63b are determined, it means that the third reference straight line S43 is also defined.

A shape of each of the pattern regions 430 may be a polygon or a deformed polygon, and has a plurality of vertices 430a. Taking FIG. 4 for example, the shape of each of the pattern regions 430 can be a deformed quadrilateral. Accordingly, although the shape of the pattern region 430 is somewhat different from a general quadrilateral (such as a rectangle), the four vertices 430a of each of the pattern regions 430 can still be identified. The two end points E63a and E63b of the third reference straight line S43 may be located at the two vertices 430a adjacent to the first corner 491 and the third corner 493 respectively. That is to say, the end points E63a and E63b shown in FIG. 4 can be substantially regarded as the two vertices 430a.

It is noted that the end points E63a and E63b may be located outside the pattern regions 430a in other embodiments, and are adjacent to the first corner 491 and the third corner 493 respectively. Alternatively, the two end points E63a and E63b of the third reference straight line S43 may be located at positions of the two openings adjacent to the first corner 491 and the third corner 493 respectively, in which any one of these end points E63a and E63b may be located at an edge of one of the openings or located in one of the openings. Hence, any one of the end points E63a and E63b shown in FIG. 4 is not limited to being located at the vertex 430a.

Afterwards, the third maximum offset length L4 between the pattern regions 430 adjacent to the first short side 421 and the third reference straight line S43 is measured, in which the third maximum offset length L4 is perpendicular to the third reference straight line S43. Like the embodiment of FIG. 1A, each of the pattern regions 430 has a plurality of contours 430e, and the third maximum offset length L4 is a maximum distance between the contours 430e adjacent to the first short side 421 and the third reference straight line S43. The definition of the third reference straight line S43 and the measurement of the third maximum offset length L4 can both be performed by using a size measuring instrument, in which the third maximum offset length L4 can further be obtained based on the above mathematical formula (1). When the third maximum offset length L4 is greater than 10 μm, it is determined that the metal mask 400 is a disqualified mask. Conversely, when the third maximum offset length L4 is less than or equal to 10 μm, it is determined that the metal mask 400 is a mask that meets the inspecting standard, that is, the qualified metal mask 400 that meets the requirements of the process.

In the embodiment shown in FIG. 4, both the first long side 411 and the second long side 412 are straight lines. However, in other embodiments (for example, the embodiment shown in FIG. 1A), the first long side 411 and the second long side 412 may both be curves. Thus, FIG. 4 does not limit the shapes of the first long side 411 and the second long side 412. In addition, based on the third reference straight line S43 shown in FIG. 4, a fourth reference straight line (not shown) adjacent to the second side 422 can further be defined. Two end points of the fourth reference straight line are adjacent to the second corner 492 and the fourth corner 494 respectively, and a fourth maximum offset length can further be measured by utilizing the fourth reference straight line to ensure that the metal mask 400 is suitable for PVD, thus avoiding reducing the yield of display panels (such as OLED display panels).

Figure 5A:
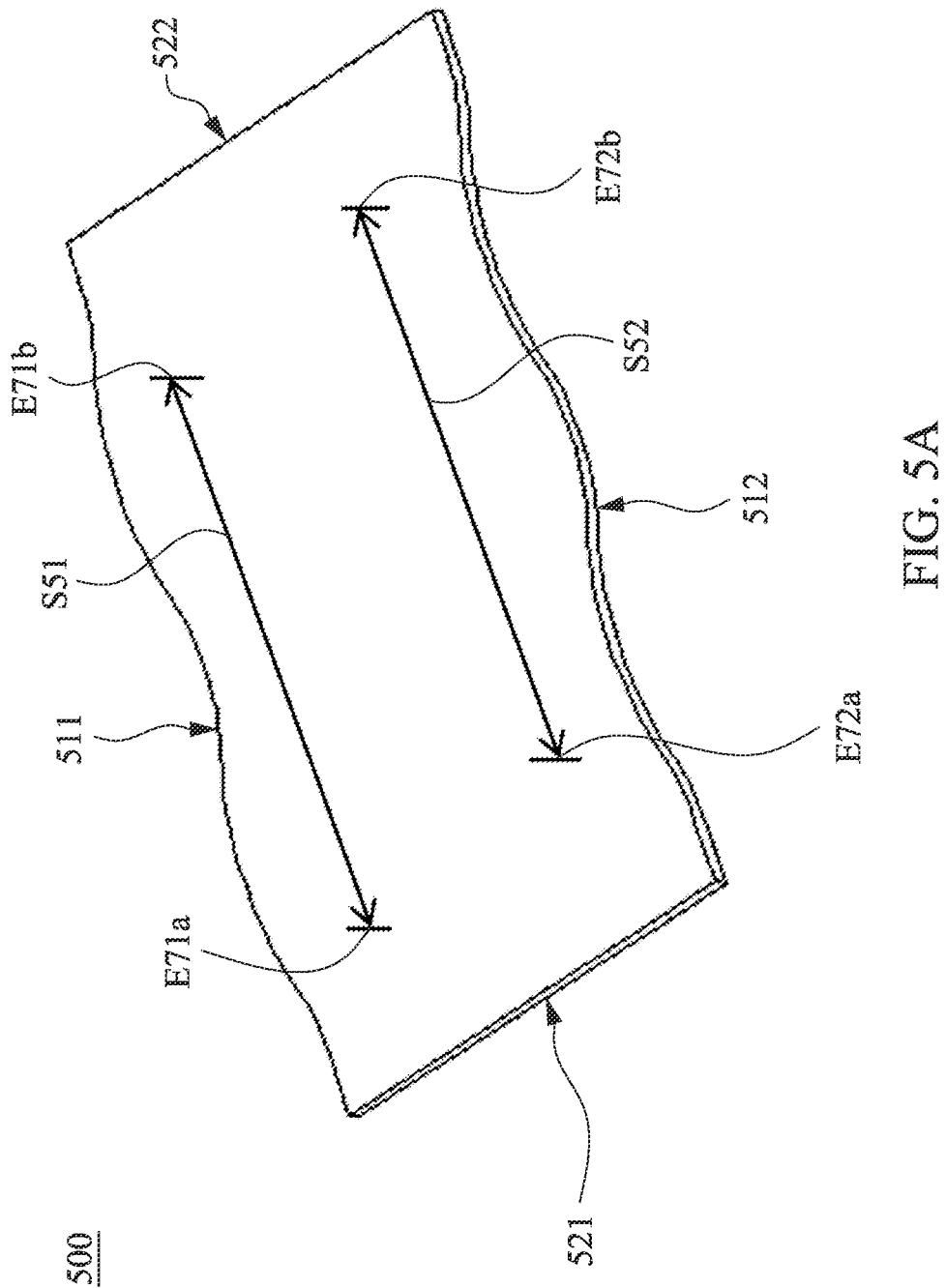
FIG. 5A depicts a schematic top view of a metal mask inspected by utilizing an inspecting method according to another embodiment of the present disclosure.
Figure 5B:
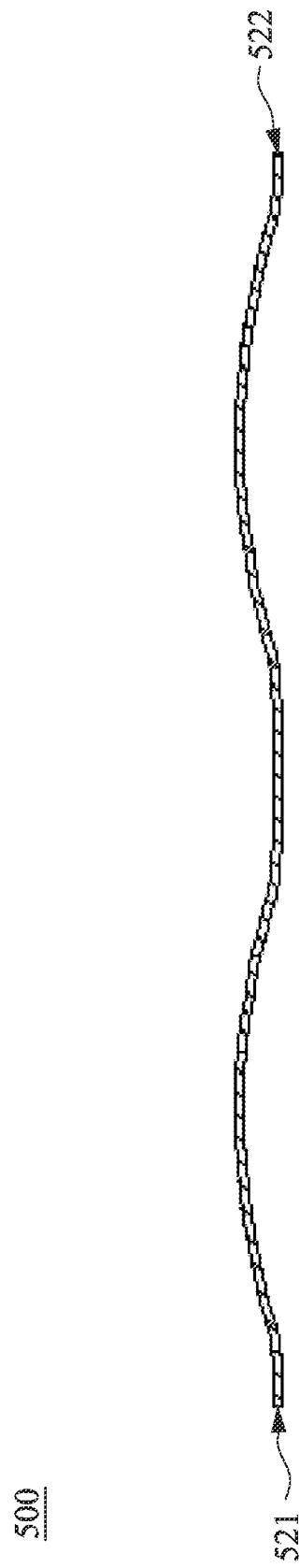
FIG. 5B depicts a schematic side view of the metal mask in FIG. 5A.

FIG. 5A depicts a schematic top view of a metal mask inspected by utilizing an inspecting method according to another embodiment of the present disclosure, and FIG. 5B depicts a schematic side view of the metal mask in FIG. 5A. Referring to FIG. 5A and FIG. 5B, first, a metal mask 500 is provided. The metal mask 500 has a first long side 511 and a second long side 512 opposite to each other, a first short side 521 and a second short side 522 opposite to each other, and a plurality of pattern regions (not shown). As the same as the metal mask 100, the first long side 511, the second long side 512, the first short side 521, and the second short side 522 are connected and surround the pattern regions. Moreover, the metal mask 500 may also be formed by calendering and photolithography of a metal material in sequence, or may be formed by electroforming, so the metal mask 500 is warped and become uneven, as shown in FIG. 5B.

Afterwards, a first reference straight line S51 and a second reference straight line S52 that are parallel and separated from each other are defined on the warped metal mask 500, in which the first reference straight line S51 does not intersect or overlap with the second reference straight line S52, and the lengths of both the first reference straight line S51 and the second reference straight line S52 may be equal. The first reference straight line S51 has end points E71a and E71b, and the second reference straight line S52 has end points E72a and E72b. Hence, the first reference straight line S51 and the second reference straight line S52 are both not straight lines of infinite length.

In the embodiment, at least one alignment mark (not shown) can be formed on the metal mask 500 at first, and one alignment mark can be located on one of the end points E71a, E71b, E72a, and E72b. A size measuring instrument can detect the alignment mark and define coordinate values of the end points E71a, E71b, E72a, and E72b based on a position of the alignment mark. In this manner, the size measuring instrument can calculate the lengths of both the first reference straight line S51 and the second reference straight line S52.

The first reference straight line S51 may be substantially parallel to the second reference straight line S52, so the parallelism between the first reference straight line S51 and the second reference straight line S52 can include non-parallelism caused by an allowable tolerance range which may be within 3 µm. Additionally, a distance between the first reference straight line S51 and the second reference straight line S52 may be between 3 centimeters (cm) and 25 cm, and the tolerance of this distance may be within ±3 µm.

Figure 5C:
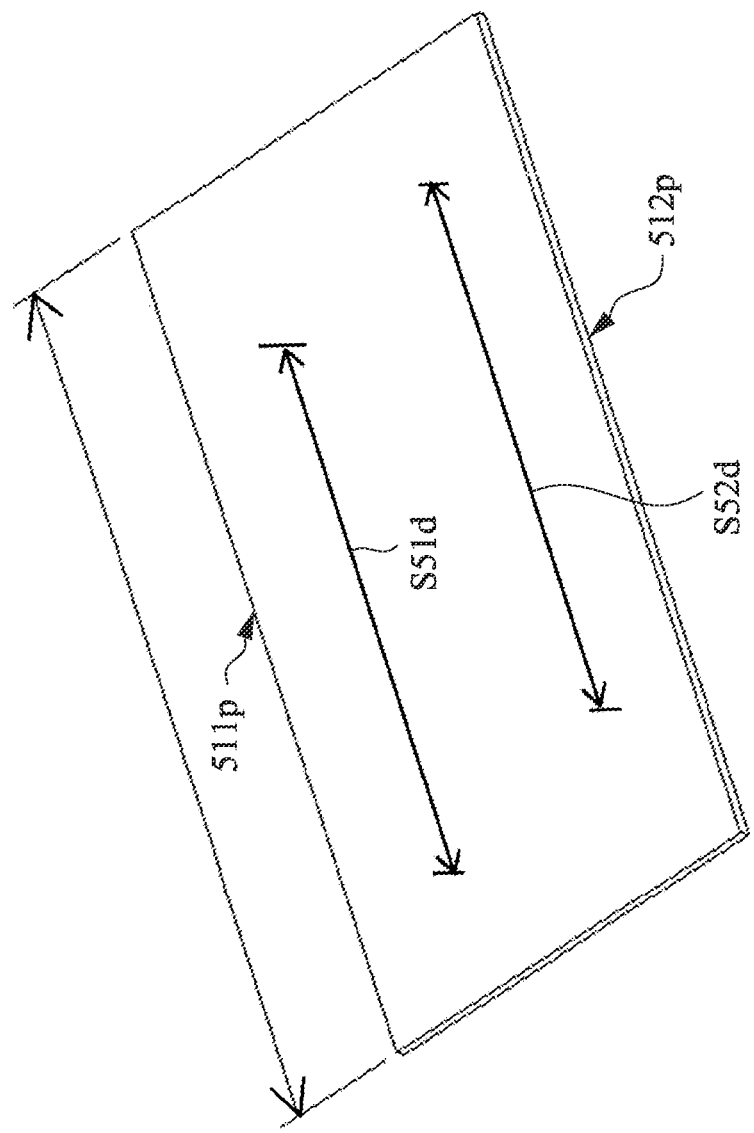
FIG. 5C depicts a schematic top view of the metal mask in FIG. 5A after being flattened.

FIG. 5C depicts a schematic top view of the metal mask in FIG. 5A after being flattened. Referring to FIG. 5C, then, the metal mask 500 is flattened so that the first reference straight line S51 becomes a first deformed line S51d, and the second reference straight line S52 becomes a second deformed line S52d. When the metal mask 500 is flattened, the first long side 511, the second long side 512, the first short side 521, and the second short side 522 are also deformed. For example, the first long side 511 becomes a longer first long side 511p, and the second long side 512 becomes a longer second long side 512p.

Figure 5D:
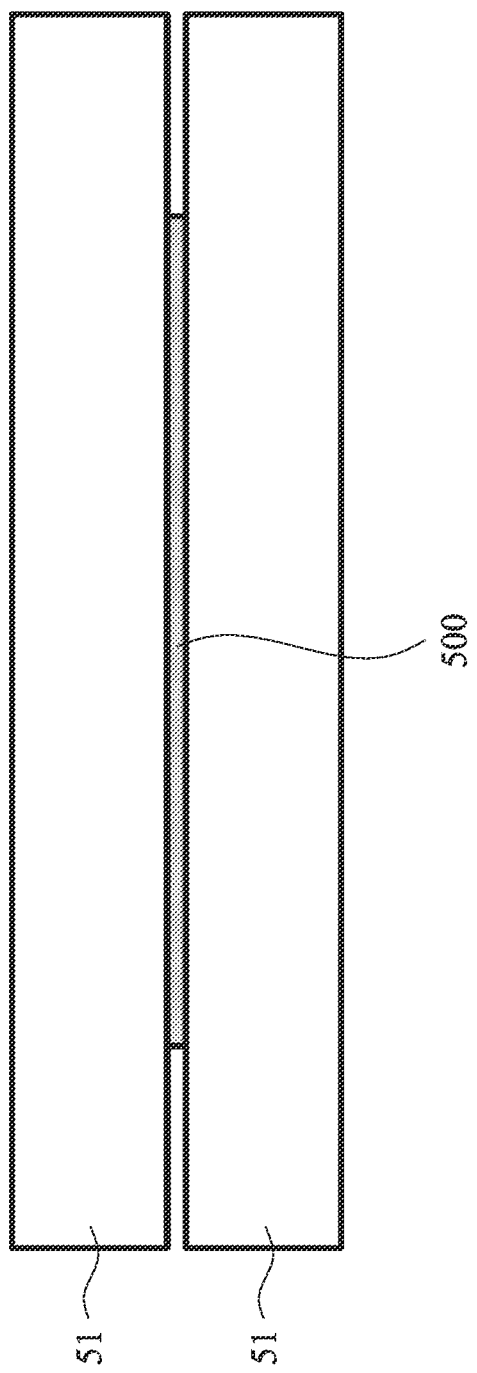
FIG. 5D depicts a schematic side view of the metal mask in FIG. 5C sandwiched between two rigid substrates.

FIG. 5D depicts a schematic side view of the metal mask in FIG. 5C sandwiched between two rigid substrates. Referring to FIG. 5C and FIG. 5D, the method of flattening the metal mask 500 may be to sandwich the metal mask 500 between two rigid substrates 51, so that the rigid substrates 51 flatten the metal mask 500, in which the rigid substrate 51 may be a glass plate or a steel plate.

Referring to FIG. 5A and FIG. 5C, afterwards, the lengths of the first reference straight line S51 and the second reference straight line S52, and lengths of the first deformed line S51d and the second deformed line S52d are determined whether or not to satisfy the following mathematical formula (3).

$$|(L3+L4)/2-(L1+L2)/2| \leq 20 \text{ (µm)} \qquad \text{Mathematical formula (3)}$$

In the above mathematical formula (3), L1 is the length of the first reference straight line S51, L2 is the length of the second reference straight line S52, L3 is the length of the first deformed line S51d, and L4 is the length of the second deformed line S52d. When the length of the first reference straight line S51, the length of the second reference straight line S52, the length of the first deformed line S51d, and the length of the second deformed line S52d satisfy the mathematical formula (3), the metal mask 500 is determined to be a qualified mask that meets the inspecting standard.

In addition, the length of the first reference straight line S51, the length of the second reference straight line S52, the length of the first deformed line S51d, and the length of the second deformed line S52d can be measured by utilizing the size measuring instrument, where the mathematical formula (3) can also be operated by the size measuring instrument. The size measuring instrument can automatically select the positions of two end points of the first deformed line S51d and the positions of two end points of the second deformed line S52d based on the position of the above alignment mark, thus calculating the length of the first deformed line S51d and the length of the second deformed line S52d.

Figure 6:
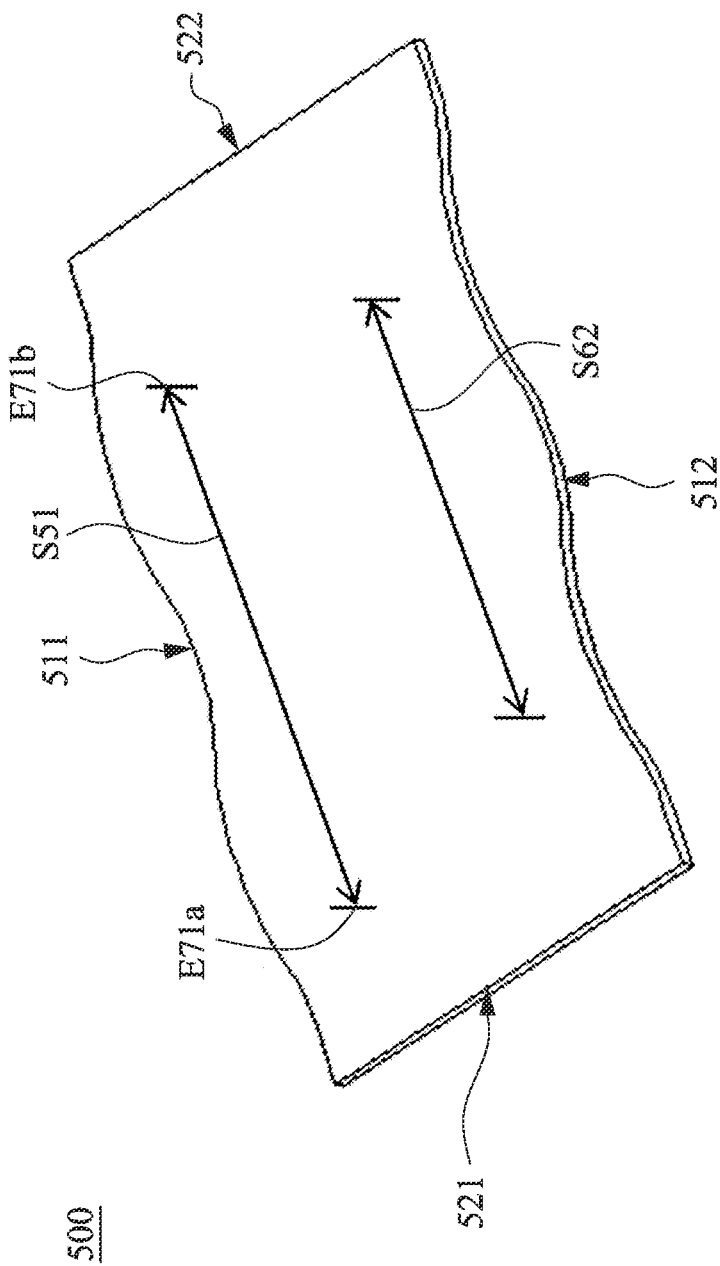
FIG. 6 depicts a schematic top view of a metal mask inspected by utilizing an inspecting method according to still another embodiment of the present disclosure.

It is worth mentioning that in the embodiment shown in FIG. 5A, the lengths of both the first reference straight line S51 and the second reference straight line S52 are equal. However, the lengths of both the first reference straight line S51 and the second reference straight line S52 may be unequal in other embodiments. For example, in the embodiment shown in FIG. 6, the first reference straight line S51 and a second reference straight line S62 that are parallel and separated from each other can be defined on the warped metal mask 500, in which the length of the first reference straight line S51 is not equal to the length of the second reference straight line S62. For example, the length of the first reference straight line S51 is greater than the length of the second reference straight line S62, as shown in FIG. 6. Accordingly, the lengths of the first reference straight line S51 and the second reference straight line S52 in FIG. 5A are not limited to being equal.

In summary, the inspecting method according to at least one embodiment of the present disclosure can help to choose the qualified metal mask and eliminate the disqualified metal mask to prevent the metal mask ineligible for PVD (for example, evaporation) from being used to manufacture a display panel (such as OLED display panel). Consequently, the output of defective display panels can be reduced to improve the yield.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inspecting method of a metal mask comprising:
   providing a metal mask, wherein the metal mask has a first long side and a second long side opposite to each other, a first short side and a second short side opposite to each other, and a plurality of pattern regions, wherein the first long side, the second long side, the first short side, and the second short side surround the pattern regions;
   defining a first reference straight line and a second reference straight line based on the pattern regions adjacent to the first long side and the second long side, wherein the first reference straight line is adjacent to the first long side and extends along the first long side, the second reference straight line is adjacent to the second long side and extends along the second long side;
   measuring a first maximum offset length between the pattern regions adjacent to the first long side and the first reference straight line, wherein the first maximum offset length is perpendicular to the first reference straight line;
   measuring a second maximum offset length between the pattern regions adjacent to the second long side and the second reference straight line, wherein the second maximum offset length is perpendicular to the second reference straight line; and
   determining the metal mask to meet an inspecting standard when a difference between the first maximum offset length and the second maximum offset length is less than or equal to 20 μm.

2. The inspecting method of the metal mask of claim 1, further comprising:
   determining the metal mask to meet the inspecting standard when the first maximum offset length is less than or equal to 30 μm; and
   determining the metal mask to be a disqualified mask when the first maximum offset length is greater than 30 μm.

3. The inspecting method of the metal mask of claim 2, further comprising:
   determining the metal mask to meet the inspecting standard when the second maximum offset length is less than or equal to 30 μm; and
   determining the metal mask to be the disqualified mask when the second maximum offset length is greater than 30 μm.

4. The inspecting method of the metal mask of claim 1, further comprising:
   defining a third reference straight line based on the pattern regions adjacent to the first short side, wherein the third reference straight line is adjacent to the first short side and extends along the first short side;
   measuring a third maximum offset length between the pattern regions adjacent to the first short side and the third reference straight line, wherein the third maximum offset length is perpendicular to the third reference straight line;
   determining the metal mask to meet the inspecting standard when the third maximum offset length is less than or equal to 10 μm; and
   determining the metal mask to be a disqualified mask when the third maximum offset length is greater than 10 μm.

5. An inspecting method of a metal mask comprising:
   defining a first reference straight line and a second reference straight line that are parallel and separated from each other on a warped metal mask, wherein a length of the first reference straight line is L1, a length of the second reference straight line is L2;
   flattening the metal mask so that the first reference straight line becomes a first deformed line, and the second reference straight line becomes a second deformed line, wherein a length of the first deformed line is L3, and a length of the second deformed line is L4; and
   determining whether or not the length L1 of the first reference straight line, the length L2 of the second reference straight line, the length L3 of the first deformed line, and the length L4 of the second deformed line satisfy a mathematical formula:

$$|(L3+L4)/2-(L1+L2)/2| \leq 20 \text{ (μm); and}$$

determining the metal mask to meet an inspecting standard when the length L1 of the first reference straight line, the length L2 of the second reference straight line, the length L3 of the first deformed line, and the length L4 of the second deformed line satisfy the mathematical formula.

6. The inspecting method of the metal mask of claim 5, wherein the method of flattening the metal mask comprises to sandwich the metal mask between two rigid substrates, so that the rigid substrates flatten the metal mask.

7. The inspecting method of the metal mask of claim 5, wherein a distance between the first reference straight line and the second reference straight line is between 3 cm and 25 cm.

8. The inspecting method of the metal mask of claim 5, wherein the lengths of both the first reference straight line and the second reference straight line are unequal.

9. An inspecting method of a metal mask comprising:
   providing a metal mask, wherein the metal mask has a first long side and a second long side opposite to each other, a first short side and a second short side opposite to each other, and a plurality of pattern regions, wherein the first long side, the second long side, the first short side, and the second short side surround the pattern regions, and the pattern regions are arranged regularly;
   defining a first reference straight line and a second reference straight line based on the pattern regions adjacent to the first long side and the second long side, wherein the first reference straight line is adjacent to the first long side and extends along the first long side, the second reference straight line is adjacent to the second long side and extends along the second long side;
   measuring a first maximum offset length between the pattern regions adjacent to the first long side and the first reference straight line, wherein the first maximum offset length is perpendicular to the first reference straight line;
   measuring a second maximum offset length between the pattern regions adjacent to the second long side and the second reference straight line, wherein the second maximum offset length is perpendicular to the second reference straight line; and
   determining the metal mask to meet an inspecting standard when the first maximum offset length and the second maximum offset length are less than or equal to 30 μm.

10. A metal mask comprising:
    a substrate having a first long side and a second long side opposite to each other, a first short side and a second short side opposite to each other, and a plurality of pattern regions, wherein the first long side, the first short side, the second long side, and the second short side are connected in sequence and surround the pattern regions, wherein a first reference straight line and a second reference straight line are defined on the substrate, wherein the first reference straight line is adjacent to the first long side and extends along the first long side, and the second reference straight line is adjacent to the second long side and extends along the second long side, wherein there is a first maximum offset length between the pattern regions adjacent to the first long side and the first reference straight line, and the first maximum offset length is perpendicular to the first reference straight line, wherein there is a second maximum offset length between the pattern regions adjacent to the second long side and the second reference straight line, and the second maximum offset length is perpendicular to the second reference straight line, wherein a difference between the first maximum offset length and the second maximum offset length is less than or equal to 20 μm.

11. The metal mask of claim 10, wherein the pattern regions are arranged regularly.

12. The metal mask of claim 10, wherein two end points of the first reference straight line are adjacent to the first short side and the second short side respectively, and two end points of the second reference straight line are adjacent to the first short side and the second short side respectively.

13. The metal mask of claim 10, wherein each of the pattern regions has a plurality of contours, the first maximum offset length is a maximum distance between the contours adjacent to the first long side and the first reference straight line, wherein the second maximum offset length is a maximum distance between the contours adjacent to the second long side and the second reference straight line.

14. The metal mask of claim 10, wherein a shape of each of the pattern regions is a polygon, wherein each of the pattern regions has a plurality of vertices;

a first corner is formed between the first long side and the first short side;

a second corner is formed between the first long side and the second short side;

a third corner is formed between the second long side and the first short side; and a fourth corner is formed between the second long side and the second short side;

wherein two end points of the first reference straight line are located at two of the vertices adjacent to the first corner and the second corner respectively, and two end points of the second reference straight line are located at two of the vertices adjacent to the third corner and the fourth corner respectively.

15. The metal mask of claim 14, wherein the shape of each of the pattern regions is a quadrilateral or a hexagon.

16. The metal mask of claim 10, wherein a first corner is formed between the first long side and the first short side;

a second corner is formed between the first long side and the second short side;

a third corner is formed between the second long side and the first short side;

a fourth corner is formed between the second long side and the second short side;

two end points of the first reference straight line and two end points of the second reference straight line are all located outside the pattern regions, and are adjacent to the first corner, the second corner, the third corner, and the fourth corner respectively.

17. The metal mask of claim 10, wherein each of the pattern regions has a plurality of openings;

a first corner is formed between the first long side and the first short side;

a second corner is formed between the first long side and the second short side;

a third corner is formed between the second long side and the first short side;

a fourth corner is formed between the second long side and the second short side;

two end points of the first reference straight line are located at positions of two of the openings adjacent to the first corner and the second corner respectively, and two end points of the second reference straight line are located at positions of two of the openings adjacent to the third corner and the fourth corner respectively.

18. The metal mask of claim 10, wherein a shape of each of the pattern regions is a circle, wherein each of the pattern regions has a center;

a first corner is formed between the first long side and the first short side;

a second corner is formed between the first long side and the second short side;

a third corner is formed between the second long side and the first short side;

a fourth corner is formed between the second long side and the second short side;

two end points of the first reference straight line are located at two of the centers adjacent to the first corner and the second corner respectively, and two end points of the second reference straight line are located at two of the centers adjacent to the third corner and the fourth corner respectively, wherein the first maximum offset length is a maximum distance between the centers adjacent to the first long side and the first reference straight line, and the second maximum offset length is a maximum distance between the centers adjacent to the second long side and the second reference straight line.

* * * * *

UNITED STATES PATENT AND TRADEMARK OFFICE
CERTIFICATE OF CORRECTION

PATENT NO. : 11,980,043 B2
APPLICATION NO. : 17/523947
DATED : May 7, 2024
INVENTOR(S) : Yun-Pei Yang et al.

It is certified that error appears in the above-identified patent and that said Letters Patent is hereby corrected as shown below:

On the Title Page

Item (54) and in the Specification, Column 1, Lines 1-4, Title should be as follows:
DISPLAY PANEL METAL MASK IMPROVED QUALITY STANDARD DETECTION AND INSPECTING METHOD THEREOF Signed and Sealed this
Second Day of July, 2024

Katherine Kelly Vidal
*Director of the United States Patent and Trademark Office*